United States Patent
Oh et al.

(10) Patent No.: US 12,236,817 B2
(45) Date of Patent: Feb. 25, 2025

(54) DISPLAY PANEL TEST CIRCUIT AND DISPLAY DEVICE INCLUDING THE SAME

(71) Applicant: Samsung Display Co., Ltd., Yongin-Si (KR)

(72) Inventors: Choonghee Oh, Hwaseong-si (KR); Taehoon Kwon, Suwon-si (KR); Sukyoung Kim, Hwaseong-si (KR); Ahyoung Kim, Hwaseong-si (KR); Hwayoung Song, Asan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 74 days.

(21) Appl. No.: 17/889,250

(22) Filed: Aug. 16, 2022

(65) Prior Publication Data

US 2023/0306883 A1 Sep. 28, 2023

(30) Foreign Application Priority Data

Feb. 9, 2022 (KR) .................. 10-2022-0017095

(51) Int. Cl.
*G09G 3/00* (2006.01)
*H01L 27/12* (2006.01)

(52) U.S. Cl.
CPC .......... *G09G 3/006* (2013.01); *H01L 27/124* (2013.01); *G09G 2300/0443* (2013.01); *G09G 2300/0452* (2013.01); *G09G 2330/12* (2013.01)

(58) Field of Classification Search
CPC .............. G09G 3/3291; G09G 3/006; G09G 2300/0426; G09G 2310/0291; G09G 2310/0297; G09G 2330/12; G09G 2300/0443; G09G 2300/0452; H01L 27/124
See application file for complete search history.

(56) References Cited

U.S. PATENT DOCUMENTS

2004/0222814 A1* 11/2004 Kim .................. G09G 3/006
324/760.01
2014/0139255 A1* 5/2014 Chen ................. G09G 3/006
324/760.01

(Continued)

FOREIGN PATENT DOCUMENTS

KR 10-2096622 B1 4/2020

*Primary Examiner* — Shaheda A Abdin
(74) *Attorney, Agent, or Firm* — Innovation Counsel LLP

(57) ABSTRACT

A display device includes a first pixel row, a first first-structure transmission line, a first second-structure transmission line, a first transistor, and a second transistor. The first pixel row includes a first first-color sub-pixel and a second first-color sub-pixel both for displaying a first color. The first second-structure transmission line neighbors the first first-structure transmission line with no intervening transmission line analogous to the first first-structure transmission line or the first second-structure transmission line being disposed between the first first-structure transmission line and the first second-structure transmission line. The first transistor is electrically connected through the first first-structure transmission line to the first first-color sub-pixel and receives a first test voltage. The second transistor is electrically connected through the first second-structure transmission line to the second first-color sub-pixel and receives a second test voltage different from the first test voltage.

20 Claims, 10 Drawing Sheets

(56) References Cited

U.S. PATENT DOCUMENTS

2016/0260367 A1\* 9/2016 Kwak .................. G09G 3/3291
2019/0180663 A1\* 6/2019 Lee ....................... G09G 3/006
2020/0302840 A1\* 9/2020 Kim ...................... G09G 3/006

\* cited by examiner

DISPLAY PANEL TEST CIRCUIT AND DISPLAY DEVICE INCLUDING THE SAME

CROSS-REFERENCE TO RELATED APPLICATION(S)

This application claims priority under 35 USC § 119 to Korean Patent Application No. 10-2022-0017095 filed on Feb. 9, 2022 in the Korean Intellectual Property Office (KIPO); the Korean Patent Application is incorporated by reference.

BACKGROUND

1. Field

Embodiments relate to a display device. More particularly, embodiments related to a display panel test circuit for testing a display panel, and a display device including the display panel test circuit.

2. Description of the Related Art

A display device may include a display panel including a plurality of pixels for displaying images in response to input signals. The display device may include a display panel driving circuit configured to drive the display panel. The display device may further include a display panel test circuit configured to test the display panel.

In a manufacturing process of the display device, an open-short test (i.e., a test for detecting an open line and a short circuit between lines) and the like may be performed on the display panel using the display panel test circuit. The open-short test may be performed through an image displayed on the display panel when test voltages are applied to lines (e.g., fan-out lines) that are electrically connected to the pixels. However, even when a short circuit occurs between the lines, the image displayed on the display panel may still appear normal, such that an undesirable short circuit between the lines may not be detected.

SUMMARY

Embodiments may be related to a display panel test circuit for accurately detecting a short failure between fan-out lines of a display panel.

Embodiments may be related to a display device including the display panel test circuit.

A display device according to embodiments may include a display panel including a plurality of sub-pixels disposed in a first pixel row in a first display area and a second display area that is adjacent to the first display area in a first direction, and a plurality of fan-out lines including first fan-out lines electrically connected to sub-pixels disposed in the first display area among the sub-pixels, and arranged in the first direction in a first non-display area that is adjacent to the first display area in a second direction intersecting the first direction, and second fan-out lines electrically connected to sub-pixels disposed in the second display area among the sub-pixels, and alternately arranged with the first fan-out lines in the first direction in the first non-display area, and a display panel test circuit including a plurality of transistors electrically connected to the fan-out lines, respectively, in which each of the transistors is configured to receive a first test voltage or a second test voltage that is different from the first test voltage. Transistors connected to one of the first fan-out lines and one of the second fan-out lines, which are adjacent to each other in the first direction and electrically connected to sub-pixels configured to display a same color among the sub-pixels, respectively, among the transistors may be configured to receive mutually different test voltages.

In an embodiment, the transistors may include a first transistor including a first terminal connected to a first fan-out line electrically connected to a first red sub-pixel disposed in the first display area among the first fan-out lines, and a second terminal configured to receive the first test voltage, a second transistor including a first terminal connected to a second fan-out line electrically connected to a first green sub-pixel disposed in the second display area among the second fan-out lines, and a second terminal configured to receive the second test voltage, a third transistor including a first terminal connected to a first fan-out line electrically connected to a second green sub-pixel disposed in the first display area among the first fan-out lines, and a second terminal configured to receive the first test voltage, a fourth transistor including a first terminal connected to a second fan-out line electrically connected to a first blue sub-pixel disposed in the second display area among the second fan-out lines, and a second terminal configured to receive the first test voltage, a fifth transistor including a first terminal connected to a first fan-out line electrically connected to a second blue sub-pixel disposed in the first display area among the first fan-out lines, and a second terminal configured to receive the second test voltage, a sixth transistor including a first terminal connected to a second fan-out line electrically connected to a third green sub-pixel disposed in the second display area among the second fan-out lines, and a second terminal configured to receive the first test voltage, a seventh transistor including a first terminal connected to a first fan-out line electrically connected to a fourth green sub-pixel disposed in the first display area among the first fan-out lines, and a second terminal configured to receive the second test voltage, and an eighth transistor including a first terminal connected to a second fan-out line electrically connected to a second red sub-pixel disposed in the second display area among the second fan-out lines, and a second terminal configured to receive the second test voltage.

The first transistor, the second transistor, the third transistor, the fourth transistor, the fifth transistor, the sixth transistor, the seventh transistor, and the eighth transistor may be sequentially arranged in a direction that is opposite to the first direction.

The second red sub-pixel, the third green sub-pixel, the first blue sub-pixel, the first green sub-pixel, the first red sub-pixel, the second green sub-pixel, the second blue sub-pixel, and the fourth green sub-pixel may be sequentially arranged in a direction that is opposite to the first direction.

When an open failure or a short failure does not occur in the fan-out lines, an image in which a black line and a white line are alternately arranged in the first direction may be displayed in the first display area, and an image in which a magenta line and a green line are alternately arranged in the first direction may be displayed in the second display area.

A voltage level of the first test voltage may be higher than a voltage level of the second test voltage.

The first test voltage may be a non-light emission voltage of the sub-pixels, and the second test voltage may be a light emission voltage of the sub-pixels.

A gate terminal of each of the first to eighth transistors may be configured to receive a test control signal.

The first to eighth transistors may be simultaneously turned on in response to the test control signal.

The first fan-out lines may be disposed in a first layer on a substrate, and the second fan-out lines may be disposed in a second layer that is higher than the first layer on the substrate.

The first fan-out lines may be directly connected to first data lines connected to the sub-pixels disposed in the first display area, and the second fan-out lines may be connected to second data lines connected to the sub-pixels disposed in the second display area through connection lines.

The connection lines may include first connection lines extending in the first direction, and second connection lines extending in the second direction. The first connection lines may be disposed in a third layer that is higher than the second layer on the substrate. The second connection lines may be disposed in a fourth layer that is higher than the third layer on the substrate.

A display panel test circuit according to embodiments may include a plurality of transistors electrically connected to a plurality of fan-out lines, respectively, in which the fan-out lines include first fan-out lines electrically connected to sub-pixels disposed in a first display area among a plurality of sub-pixels disposed in a first pixel row, and second fan-out lines electrically connected to sub-pixels disposed in a second display area that is adjacent to the first display area in a first direction among the sub-pixels and alternately arranged with the first fan-out lines in the first direction, and each of the transistors is configured to receive a first test voltage or a second test voltage that is different from the first test voltage. Transistors connected to one of the first fan-out lines and one of the second fan-out lines, which are adjacent to each other in the first direction and electrically connected to sub-pixels configured to display a same color among the sub-pixels, respectively, among the transistors may be configured to receive mutually different test voltages.

The transistors may include a first transistor including a first terminal connected to a first fan-out line electrically connected to a first red sub-pixel disposed in the first display area among the first fan-out lines, and a second terminal configured to receive the first test voltage, a second transistor including a first terminal connected to a second fan-out line electrically connected to a first green sub-pixel disposed in the second display area among the second fan-out lines, and a second terminal configured to receive the second test voltage, a third transistor including a first terminal connected to a first fan-out line electrically connected to a second green sub-pixel disposed in the first display area among the first fan-out lines, and a second terminal configured to receive the first test voltage, a fourth transistor including a first terminal connected to a second fan-out line electrically connected to a first blue sub-pixel disposed in the second display area among the second fan-out lines, and a second terminal configured to receive the first test voltage, a fifth transistor including a first terminal connected to a first fan-out line electrically connected to a second blue sub-pixel disposed in the first display area among the first fan-out lines, and a second terminal configured to receive the second test voltage, a sixth transistor including a first terminal connected to a second fan-out line electrically connected to a third green sub-pixel disposed in the second display area among the second fan-out lines, and a second terminal configured to receive the first test voltage, a seventh transistor including a first terminal connected to a first fan-out line electrically connected to a fourth green sub-pixel disposed in the first display area among the first fan-out lines, and a second terminal configured to receive the second test voltage, and an eighth transistor including a first terminal connected to a second fan-out line electrically connected to a second red sub-pixel disposed in the second display area among the second fan-out lines, and a second terminal configured to receive the second test voltage.

The first transistor, the second transistor, the third transistor, the fourth transistor, the fifth transistor, the sixth transistor, the seventh transistor, and the eighth transistor may be sequentially arranged in a direction that is opposite to the first direction.

The second red sub-pixel, the third green sub-pixel, the first blue sub-pixel, the first green sub-pixel, the first red sub-pixel, the second green sub-pixel, the second blue sub-pixel, and the fourth green sub-pixel may be sequentially arranged in a direction that is opposite to the first direction.

A voltage level of the first test voltage may be higher than a voltage level of the second test voltage.

The first test voltage may be a non-light emission voltage of the sub-pixels, and the second test voltage may be a light emission voltage of the sub-pixels.

A gate terminal of each of the first to eighth transistors may be configured to receive a test control signal.

The first to eighth transistors may be simultaneously turned on in response to the test control signal.

An embodiment may be related to a display device. The display device may include a first pixel row, a first first-structure transmission line, a first second-structure transmission line, a first transistor, and a second transistor. The first pixel row may include a first first-color sub-pixel and a second first-color sub-pixel both configured to display a first color. The first second-structure transmission line may neighbor the first first-structure transmission line with no intervening transmission line analogous to the first first-structure transmission line or the first second-structure transmission line being disposed between the first first-structure transmission line and the first second-structure transmission line. The first transistor may be electrically connected through the first first-structure transmission line to the first first-color sub-pixel and may receive a first test voltage. The second transistor may be electrically connected through the first second-structure transmission line to the second first-color sub-pixel and may receive a second test voltage different from the first test voltage.

The first transistor may include a first terminal electrically (and directly) connected to the first first-structure transmission line and may include a second terminal configured to receive the first test voltage. The second transistor may include a first terminal electrically (and directly) connected to the first second-structure transmission line and may include a second terminal configured to receive the second test voltage. The second transistor may neighbor the first transistor with no intervening transistor analogous to the first transistor or the second transistor being disposed between the first transistor and the second transistor.

The first transistor and the second transistor may be aligned in a direction parallel to the first pixel row.

The display device may include the following elements: a second first-structure transmission line; a second second-structure transmission line; a third first-structure transmission line; a third transistor configured to receive the second test voltage; a fourth transistor configured to receive the first test voltage; and a fifth transistor configured to receive the second test voltage. The first pixel row may include a first second-color sub-pixel, a second second-color sub-pixel, and a first third-color sub-pixel disposed between the first first-color sub-pixel and the second first-color sub-pixel. Each of the first second-color sub-pixel and the second second-color sub-pixel may display a second color. The first third-color sub-pixel may be configured to display a third color. The first color, the second color, and the third color may be different from each other. The first second-color sub-pixel may be electrically connected through the second first-structure transmission line to the third transistor. The second second-color sub-pixel may be electrically connected through the second second-structure transmission line to the second transistor. The first third-color sub-pixel may be electrically connected through the third first-structure transmission line to the third transistor.

The display device may include a first display area and a second display area. The first first-color sub-pixel may be included in the first display area. The second first-color sub-pixel may be included in the second display area. When no unwanted open circuit or unwanted short circuit occurs in the third first-structure transmission line, the first first-structure transmission line, and the first second-structure transmission line, the first display area may display black lines and white lines alternately arranged in a lengthwise direction of the first pixel row, and the second display area may display magenta lines and green lines alternately arranged in the lengthwise direction of the first pixel row.

The first test voltage may be higher than the second test voltage.

The first test voltage may be a non-light emission voltage for the first first-color sub-pixel. The second test voltage may be a light emission voltage for the second first-color sub-pixel.

Each of a gate terminal of the first transistor and a gate terminal of the second transistor may receive a test control signal.

The first transistor and the second transistor may be simultaneously turned on in response to the test control signal.

The display device may include a substrate. The first first-structure transmission line may be disposed closer to the substrate than the first second-structure transmission line.

The display device may include the following elements: a first data line; a second data line electrically isolated from the first data line; and a connection line. The first first-structure transmission line may be directly connected to the first data line and may be electrically connected through the first data line to the first first-color sub-pixel. The first second-structure transmission line may be electrically connected through the connection line and the second data line to the second first-color sub-pixel.

The connection line may include a first connection line section extending parallel to the first pixel row and may include a second connection line section extending not parallel to the first pixel row. The first connection line section may be disposed farther from the substrate than the first second-structure transmission line. The second connection line section may be disposed farther from the substrate than the first connection line section.

An embodiment may be related to display panel test circuit for testing a display panel. The display panel may include a first pixel row that includes a first first-color sub-pixel and a second first-color sub-pixel both for display a first color. The display panel may further include a first first-structure transmission line and a first second-structure transmission line. The display panel test circuit may include a first transistor and a second transistor. The first transistor may be electrically connected through the first first-structure transmission line to the first first-color sub-pixel and may receive a first test voltage. The second transistor may be electrically connected through the first second-structure transmission line to the second first-color sub-pixel and may receive a second test voltage different from the first test voltage. The first second-structure transmission line may neighbor the first first-structure transmission line with no intervening transmission line analogous to the first first-structure transmission line or the first second-structure transmission line being disposed between the first first-structure transmission line and the first second-structure transmission line.

The first transistor may include a first terminal electrically (and directly) connected to the first first-structure transmission line electrically and may include a second terminal configured to receive the first test voltage. The second transistor may include a first terminal electrically (and directly) connected to the first second-structure transmission line and may include a second terminal configured to receive the second test voltage. The second transistor may neighbor the first transistor with no intervening transistor analogous to the first transistor or the second transistor being disposed between the first transistor and the second transistor.

The first transistor and the second transistor may be aligned in a direction parallel to the first row.

The display panel test circuit may include the following elements: a third transistor configured to receive the second test voltage; a fourth transistor configured to receive the first test voltage; and a fifth transistor configured to receive the second test voltage. The first pixel row may further include a first second-color sub-pixel, a second second-color sub-pixel, and a first third-color sub-pixel disposed between the first first-color sub-pixel and the second first-color sub-pixel. Each of the first second-color sub-pixel and the second second-color sub-pixel may display a second color. The first third-color sub-pixel may display a third color. The first color, the second color, and the third color may be different from each other. The display panel may further include a second first-structure transmission line, a second second-structure transmission line, and a third first-structure transmission line. The first second-color sub-pixel may be electrically connected through the second first-structure transmission line to the third transistor. The second second-color sub-pixel may be electrically connected through the second second-structure transmission line to the second transistor. The first third-color sub-pixel may be electrically connected through the third first-structure transmission line to the third transistor.

The first test voltage may be higher than the second test voltage.

The first test voltage may be a non-light emission voltage for the first first-color sub-pixel. The second test voltage may be a light emission voltage for the second first-color sub-pixel.

Each of a gate terminal of the first transistor and a gate terminal of the second transistor may receive a test control signal.

The first transistor and the second transistor may be simultaneously turned on in response to the test control signal.

In a display panel test circuit and a display device according to embodiments, two transistors connected to a first fan-out line (or first-structure transmission line) and a second fan-out line (or second-structure transmission line) that are immediately adjacent to each other and respectively electrically connected to two sub-pixels configured to display a same color may respectively receive two different test voltages, so that voltages applied to the two sub-pixels configured to display the same color may change when an unwanted short circuit occurs between the immediately adjacent first and second fan-out lines. Accordingly, the short circuit between the immediately adjacent first and second fan-out lines may be detected.

DETAILED DESCRIPTION OF EMBODIMENTS

Figure 1:
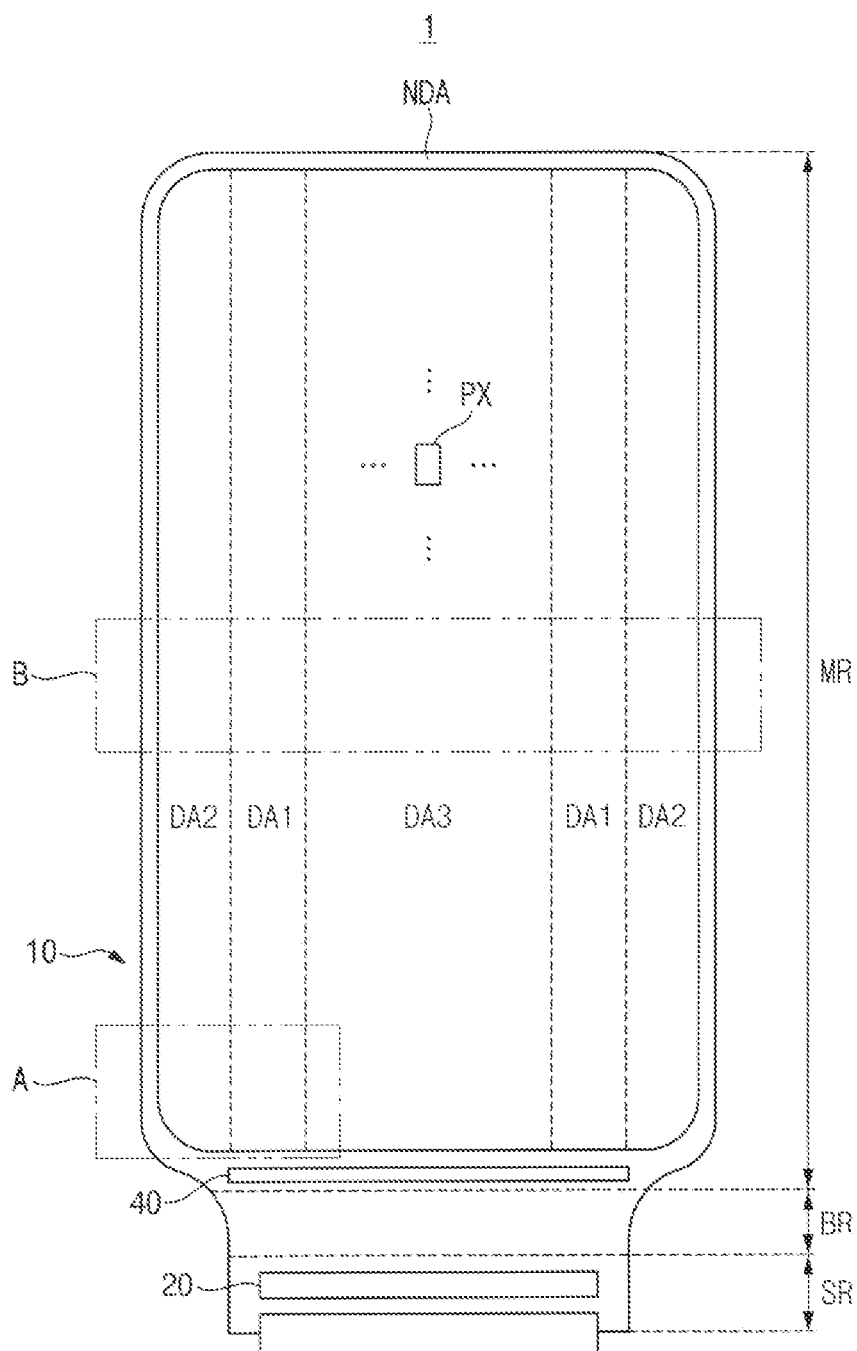
FIG. 1 is a plan view showing a display device according to one embodiment.

Examples of embodiments are described with reference to the accompanying drawings. The same or similar reference numerals/labels may be used for the same elements or similar elements in the accompanying drawings.

Although the terms "first," "second," etc. may be used to describe various elements, these elements should not be limited by these terms. These terms may be used to distinguish one element from another element. A first element may be termed a second element without departing from teachings of one or more embodiments. The description of an element as a "first" element may not require or imply the presence of a second element or other elements. The terms "first," "second," etc. may be used to differentiate different categories or sets of elements. For conciseness, the terms "first," "second," etc. may represent "first-category (or first-set)," "second-category (or second-set)," etc., respectively.

The term "connect" may mean "directly connect" or "indirectly connect." The term "connect" may mean "mechanically connect" and/or "electrically connect." The term "connected" may mean "electrically connected" or "electrically connected through no intervening transistor." The term "insulate" may mean "electrically insulate" or "electrically isolate." The term "conductive" may mean "electrically conductive." The term "drive" may mean "operate" or "control." The term "include" may mean "be made of." The expression that an element extends in a particular direction may mean that the element extends lengthwise in the particular direction and/or that the lengthwise direction of the element is in the particular direction. The term "overlap" may be equivalent to "be overlapped by." The expression that a first element overlaps with a second element in a plan view may mean that the first element overlaps the second element in direction perpendicular to a substrate. The term "adjacent" may mean "immediately adjacent." The term "fan-out line" may mean "intermediate line" or "transmission line."

Figure 2:
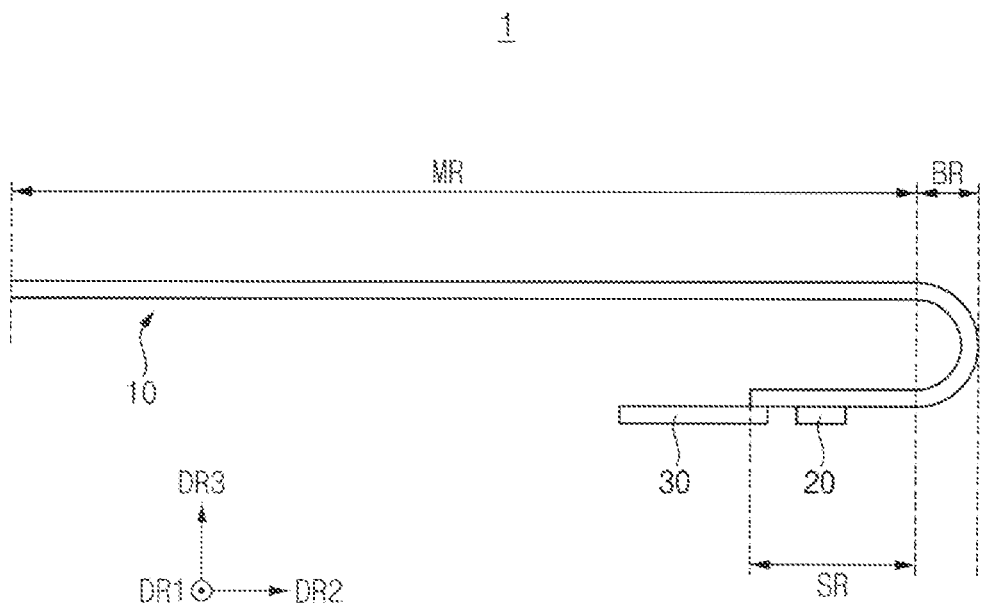
FIG. 2 is a cross-sectional view showing the display device according to one embodiment.

FIG. 1 is a plan view showing a display device 1 according to one embodiment. FIG. 2 is a cross-sectional view showing the display device 1 according to one embodiment.

Referring to FIGS. 1 and 2, the display device 1 may include a display panel 10, a driving chip 20, a driving substrate 30, and a display panel test circuit 40.

The display panel 10 may include a main region MR, a sub-region SR, and a bending region BR. The sub-region SR may be spaced apart from the main region MR. The bending region BR may be disposed between the main region MR and the sub-region SR.

The bending region BR may extend from the main region MR. A width of the bending region BR in a first direction DR1 may be smaller than a width of the main region MR in the first direction DR1. The bending region BR may be bent in a direction that is opposite to a third direction DR3 (different from and/or perpendicular to the first direction DR1) with a curvature.

The sub-region SR may extend from the bending region BR. The sub-region SR may extend parallel to the main region MR. The sub-region SR may overlap the main region MR in the third direction DR3.

The display panel 10 may include a display area DA and a non-display area NDA. The display area DA may include a plurality of pixels PX having a PENTILE™ structure. Each of the pixels PX may include one red sub-pixel, one blue sub-pixel, and two green sub-pixels. The pixels PX may be arranged in the first direction DR1 and a second direction DR2 different from and/or perpendicular to the first and third directions DR1 and DR3. The display area DA may display an image using lights emitted from the pixels PX. The non-display area NDA may not include pixels for display an image.

The display area DA may be disposed at a center portion of the main region MR. The non-display area NDA may be disposed at an edge of the main region MR, in the bending region BR, and in the sub-region SR.

The display area DA may include a first display area DA1, a second display area DA2, and a third display area DA3. The third display area DA3 may be disposed at a center portion of the display area DA in the first direction DR1. The second display area DA2 may be disposed at an edge of the display area DA in the first direction DR1. Connection lines BRS described with reference to FIG. 3, etc. may not be disposed in the third display area DA3.

The second display area DA2 may include a first portion spaced apart from the third display area DA3 in the first direction DR1, and a second portion spaced apart from the third display area DA3 in a direction that is opposite to the first direction DR1. The first display area DA1 may be disposed between the second display area DA2 and the third display area DA3 in the first direction DR1. The first display area DA1 may include a first portion disposed between the first portion of the second display area DA2 and the third display area DA3, and a second portion disposed between the second portion of the second display area DA2 and the third display area DA3. The connection lines BRS may be disposed in the first display area DA1 and the second display area DA2.

The driving chip 20 may be disposed on the sub-region SR of the display panel 10. A first pad part including a plurality of pads may be disposed in the sub-region SR of the display panel 10. The driving chip 20 may be connected to the first pad part. The driving chip 20 may include an integrated circuit configured to drive the display panel 10. The integrated circuit may be a data integrated circuit configured to generate a data voltage.

The driving chip 20 may be mounted in the sub-region SR of the display panel 10. The driving chip 20 may be attached to the sub-region SR of the display panel 10 through an anisotropic conductive film. The driving chip 20 may be attached to the sub-region SR of the display panel 10 by using ultrasonic bonding.

The driving substrate 30 may be connected to an end of the sub-region SR of the display panel 10. A second pad part including a plurality of pads may be disposed at the end of the sub-region SR of the display panel 10. The driving substrate 30 may be connected to the second pad part. The driving substrate 30 may be a flexible printed circuit board.

The display panel test circuit 40 may be mounted in the non-display area NDA of the main region MR of the display panel 10. The display panel test circuit 40 may perform an open-short test (i.e., a test for detecting an open failure of a fan-out line and a short circuit between fan-out lines) on the display panel 10. The display panel test circuit 40 is further described with reference to FIGS. 6 to 10.

Figure 3:
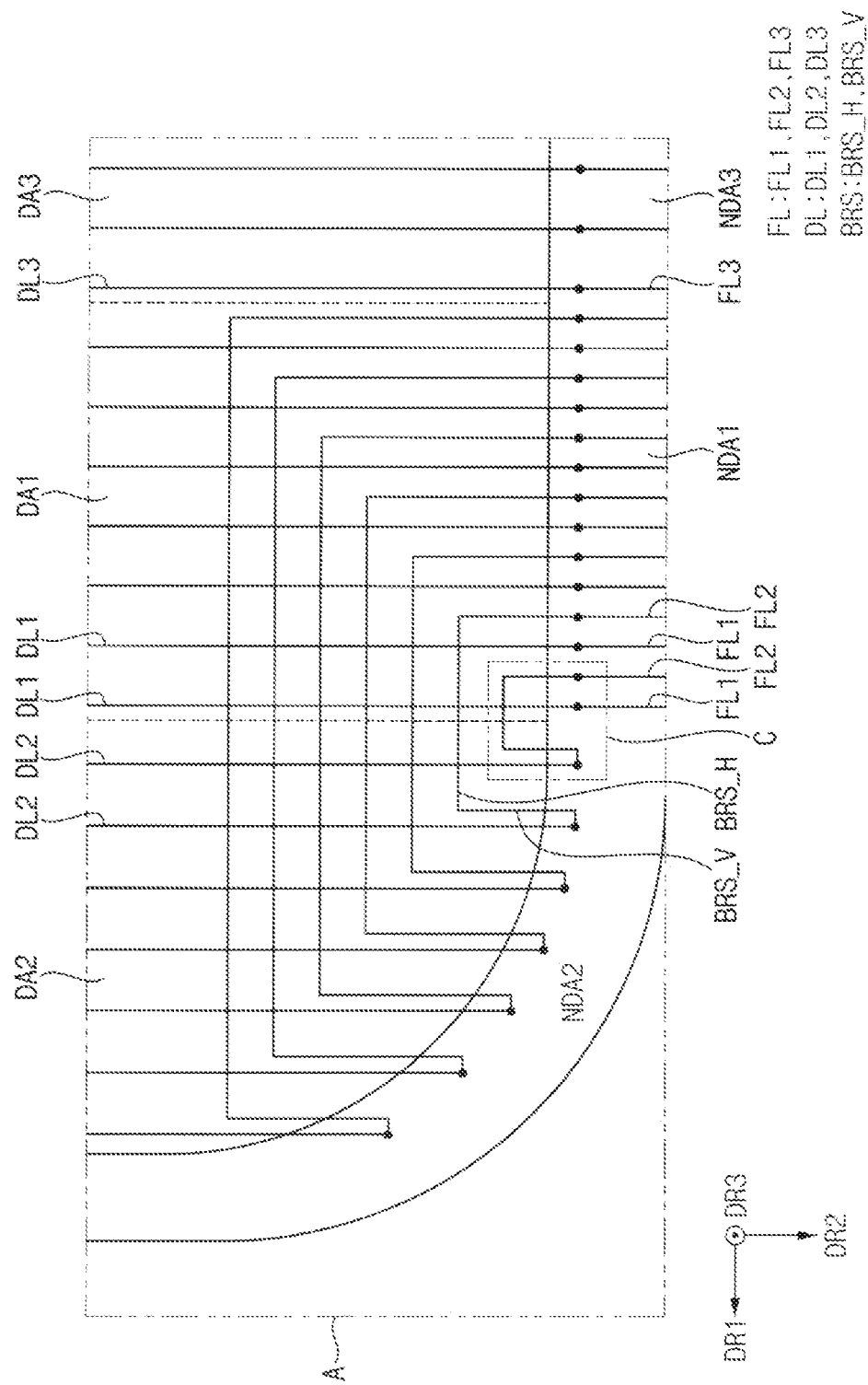
FIG. 3 is a plan view showing a region A of FIG. 1 according to one embodiment.
Figure 4:
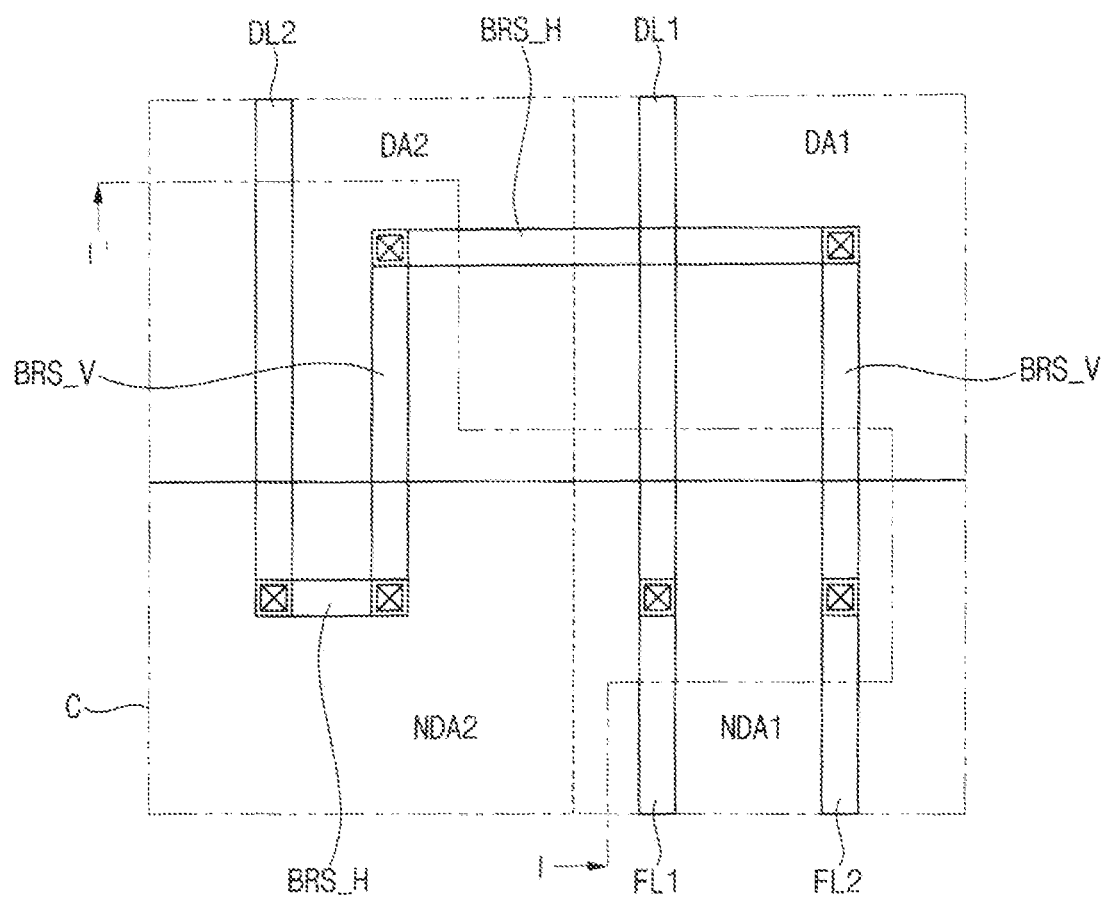
FIG. 4 is a plan view showing a region C of FIG. 3 according to one embodiment.
Figure 5:
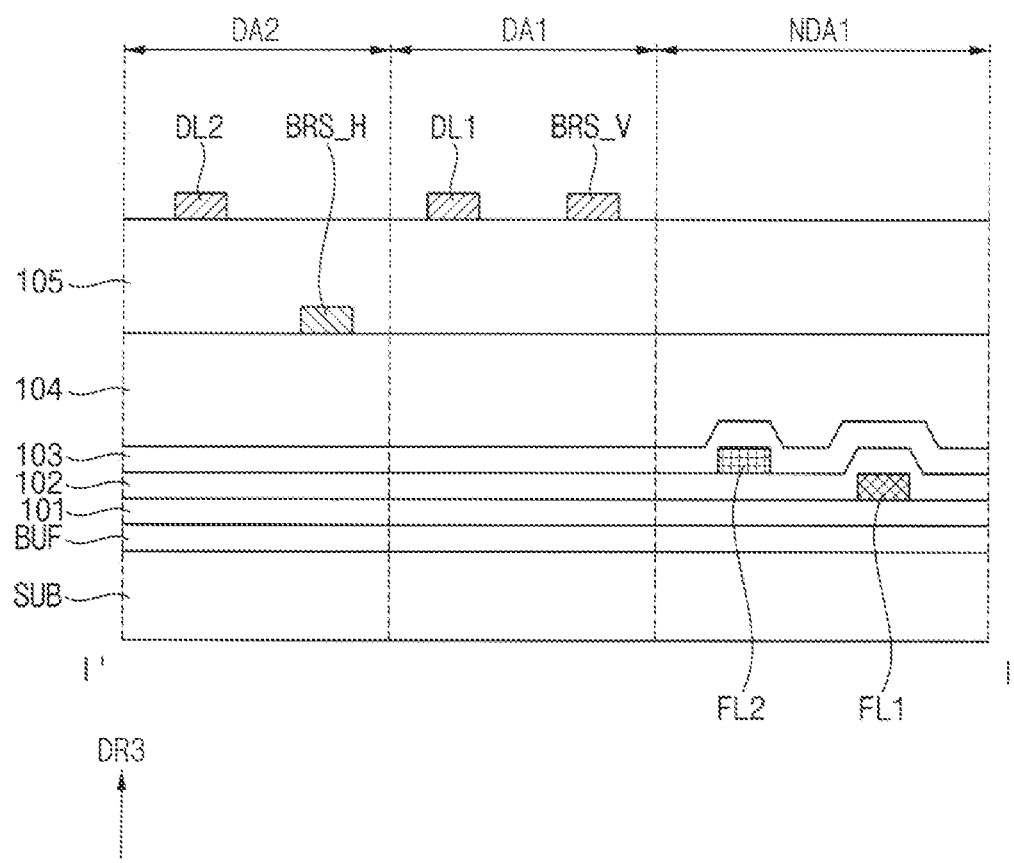
FIG. 5 is a cross-sectional view taken along line I-I' of FIG. 4 according to one embodiment.

FIG. 3 is a plan view showing a region A of FIG. 1 according to one embodiment. FIG. 4 is a plan view showing a region C of FIG. 3 according to one embodiment. FIG. 5 is a sectional view taken along line I-I' of FIG. 4 according to one embodiment.

Referring to FIGS. 1, 3, 4, and 5, the non-display area NDA may include a first non-display area NDA1, a second non-display area NDA2, and a third non-display area NDA3. The first non-display area NDA1 may be adjacent to the first display area DA1 in the second direction DR2. The second non-display area NDA2 may be adjacent to the second display area DA2 in the second direction DR2. The third non-display area NDA3 may be adjacent to the third display area DA3 in the second direction DR2.

The display panel 10 may include data lines DL, fan-out lines FL (or intermediate lines FL or transmission lines FL), and connection lines BRS.

The data lines DL may be disposed in the display area DA. The data lines DL may be arranged in the first direction DR1, and may extend in the second direction DR2. The data lines DL may cross the display area DA in the second direction DR2. First ends of the data lines DL may be disposed in the non-display area NDA. The data lines DL may transmit data voltages.

The data lines DL may include first data lines DL1, second data lines DL2, and third data lines DL3. The first data lines DL1 may be disposed in the first display area DAL. The second data lines DL2 may be disposed in the second display area DA2. The third data lines DL3 may be disposed in the third display area DA3.

The fan-out lines FL may be disposed in the non-display area NDA. The fan-out lines FL may be arranged in the first direction DR1, and may extend in the second direction DR2. The fan-out lines FL may extend from the sub-region SR to the main region MR via the bending region BR. First ends of the fan-out lines FL may be connected to the driving chip 20. The fan-out lines FL may transmit the data voltages from the driving chip 20.

The fan-out lines FL may include first fan-out lines FL1 (or first-structure transmission lines FL1), second fan-out lines FL2 (or second-structure transmission lines FL2), and third fan-out lines FL3 (or third-structure transmission lines FL3). The first fan-out lines FL1 and the second fan-out lines FL2 may be disposed in the first non-display area NDA1. The second fan-out lines FL2 may be alternately arranged with the first fan-out lines FL1 in the first direction DR1. The third fan-out lines FL3 may be disposed in the third non-display area NDA3.

Second ends of the first fan-out lines FL1 may be directly connected to first ends of the first data lines DL1. Therefore, the first fan-out lines FL1 may be directly connected to the first data lines DL1. Second ends of the third fan-out lines FL3 may be directly connected to first ends of the third data lines DL3. Therefore, the third fan-out lines FL3 may be directly connected to the third data lines DL3.

The connection lines BRS may extend from the first non-display area NDA1 to the second non-display area NDA2 via the display area DA. The connection lines BRS may connect second ends of the second fan-out lines FL2 to first ends of the second data lines DL2. Therefore, the second fan-out lines FL2 may be connected to the second data lines DL2 through the connection lines BRS. The connection lines BRS may transmit data voltages from the second fan-out lines FL2 to the second data lines DL2. The second fan-out lines FL2 may be disposed in the first non-display area NDA1, and the connection lines BRS may connect the second fan-out lines FL2 to the second data lines DL2 via the display area DA. Therefore, the fan-out lines FL may not be disposed in the second non-display area NDA2, so that the second non-display area NDA2 may be reduced. Accordingly, a dead space (or unutilized space) of the display panel 10 may be reduced.

The connection lines BRS may include first connection lines BRS_H and second connection lines BRS_V. The first connection lines BRS_H may extend in the first direction DR1. The second connection lines BRS_V may extend in the second direction DR2.

The display panel 10 may include a substrate SUB and a plurality of insulating layers disposed on the substrate SUB. The insulating layers may include a buffer layer BUF, a first insulating layer 101, a second insulating layer 102, a third insulating layer 103, a fourth insulating layer 104, and a fifth insulating layer 105.

The substrate SUB may include glass, a polymer resin, and/or the like. For example, the polymer resin may include polyethersulfone, polyarylate, polyetherimide, polyethylene naphthalate, polyethylene terephthalate, polyphenylene sulfide, polyimide, polycarbonate, cellulose triacetate, cellulose acetate propionate, and/or the like.

The buffer layer BUF may be disposed on the substrate SUB. The buffer layer BUF may include silicon oxide, silicon nitride, and/or the like. The buffer layer BUF may have a single-layer structure or a multilayer structure. The buffer layer BUF may have a multilayer structure including a silicon nitride layer and a silicon oxide layer that are sequentially stacked.

The first insulating layer 101 may be disposed on the buffer layer BUF. The first insulating layer 101 may include silicon oxide, silicon nitride, and/or the like. The first insulating layer 101 may have a single-layer structure or a multilayer structure. The first insulating layer 101 may be a silicon oxide layer.

The second insulating layer 102 may be disposed on the first insulating layer 101. The second insulating layer 102 may include silicon oxide, silicon nitride, and/or the like. The second insulating layer 102 may have a single-layer structure or a multilayer structure. The second insulating layer 102 may be a silicon nitride layer.

The third insulating layer 103 may be disposed on the second insulating layer 102. The third insulating layer 103 may include silicon oxide, silicon nitride, and/or the like. The third insulating layer 103 may have a single-layer structure or a multilayer structure. The third insulating layer 103 may have a multilayer structure including a silicon oxide layer and a silicon nitride layer that are sequentially stacked.

The fourth insulating layer 104 may be disposed on the third insulating layer 103. The fourth insulating layer 104 may include an organic insulating material and/or an inorganic insulating material. The fourth insulating layer 104 may have a single-layer structure or a multilayer structure. The fourth insulating layer 104 may be a polyimide (PI) layer.

The fifth insulating layer 105 may be disposed on the fourth insulating layer 104. The fifth insulating layer 105 may include an organic insulating material and/or an inorganic insulating material. The fifth insulating layer 105 may have a single-layer structure or a multilayer structure. The fifth insulating layer 105 may be a polyimide (PI) layer.

The first fan-out lines FL1 may be disposed in a first conductive layer on the substrate SUB. The first fan-out lines FL1 may be disposed between the first insulating layer 101 and the second insulating layer 102. The first fan-out lines FL1 may include a conductive material such as molybdenum (Mo) and/or copper (Cu).

The second fan-out lines FL2 may be disposed in a second conductive layer that is farther than the first layer from the substrate SUB. The second fan-out lines FL2 may be disposed between the second insulating layer 102 and the third insulating layer 103. The second fan-out lines FL2 may include a conductive material such as molybdenum (Mo) and/or copper (Cu).

The first connection lines BRS_H may be disposed in a third conductive layer that is farther than the second layer from the substrate SUB. The first connection lines BRS_H may be disposed between the fourth insulating layer 104 and the fifth insulating layer 105. The first connection lines BRS_H may include a conductive material such as titanium (Ti), aluminum (Al), and/or copper (Cu).

The second connection lines BRS_V and the data lines DL may be disposed in a fourth conductive layer that is farther than the third layer from the substrate SUB. The second connection lines BRS_V and the data lines DL may be disposed on the fifth insulating layer 105. The second connection lines BRS_V and the data lines DL may include a conductive material such as titanium (Ti), aluminum (Al), and/or copper (Cu).

Figure 6:
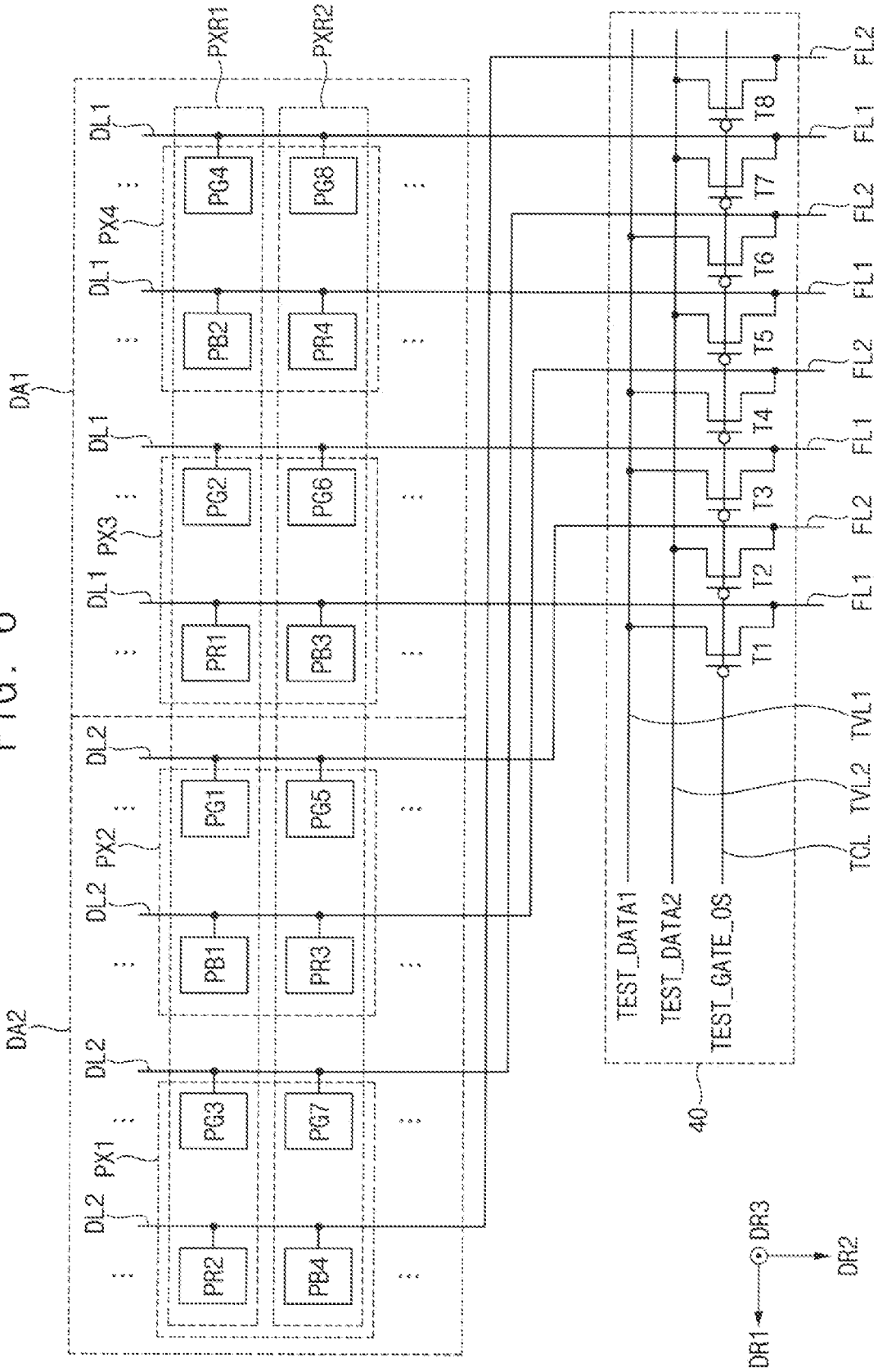
FIG. 6 is a circuit diagram showing a display panel test circuit according to one embodiment.

FIG. 6 is a circuit diagram showing a display panel test circuit 40 according to one embodiment.

Referring to FIG. 6, the display area DA may include a first pixel row PXR1 and a second pixel row PXR2. The second pixel row PXR2 may be adjacent to the first pixel row PXR1 in the second direction DR2.

The first pixel row PXR1 may include may include a first red sub-pixel PR1, a second green sub-pixel PG2, a second blue sub-pixel PB2, and a fourth green sub-pixel PG4, which are disposed in the first display area DAL. The first pixel row PXR1 may include a second red sub-pixel PR2, a third green sub-pixel PG3, a first blue sub-pixel PB1, and a first green sub-pixel PG1, which are disposed in the second display area DA2. The second red sub-pixel PR2, the third green sub-pixel PG3, the first blue sub-pixel PB1, the first green sub-pixel PG1, the first red sub-pixel PR1, the second green sub-pixel PG2, the second blue sub-pixel PB2, and the fourth green sub-pixel PG4 may be sequentially arranged in the direction that is opposite to the first direction DR1.

The second pixel row PXR2 may include a third blue sub-pixel PB3, a sixth green sub-pixel PG6, a fourth red sub-pixel PR4, and an eighth green sub-pixel PG8, which are disposed in the first display area DAL. The second pixel row PXR2 may include a fourth blue sub-pixel PB4, a seventh green sub-pixel PG7, a third red sub-pixel PR3, and a fifth green sub-pixel PG5, which are disposed in the second display area DA2. The fourth blue sub-pixel PB4, the seventh green sub-pixel PG7, the third red sub-pixel PR3, the fifth green sub-pixel PG5, the third blue sub-pixel PB3, the sixth green sub-pixel PG6, the fourth red sub-pixel PR4, and the eighth green sub-pixel PG8 may be sequentially arranged in the direction that is opposite to the first direction DR1.

The sub-pixels disposed in the first display area DA1 may be connected to the first data lines DL1, and the sub-pixels disposed in the second display area DA2 may be connected to the second data lines DL2. The second red sub-pixel PR2, the third green sub-pixel PG3, the fourth blue sub-pixel PB4, and the seventh green sub-pixel PG7 may constitute a first pixel PX1 disposed in the second display area DA2. The first blue sub-pixel PB1, the first green sub-pixel PG1, the third red sub-pixel PR3, and the fifth green sub-pixel PG5 may constitute a second pixel PX2 disposed in the second display area DA2. The first red sub-pixel PR1, the second green sub-pixel PG2, the third blue sub-pixel PB3, and the sixth green sub-pixel PG6 may constitute a third pixel PX3 disposed in the first display area DAL. The second blue sub-pixel PB2, the fourth green sub-pixel PG4, the fourth red sub-pixel PR4, and the eighth green sub-pixel PG8 may constitute a fourth pixel PX4 disposed in the first display area DAL.

The display panel test circuit 40 may include a first test voltage line TVL1, a second test voltage line TVL2, a test control line TCL, and a plurality of transistors. The first test voltage line TVL1 may transmit a first test voltage TEST_DATA1. The second test voltage line TVL2 may transmit a second test voltage TEST_DATA2. The test control line TCL may transmit a test control signal TEST_GATE_OS.

The first test voltage TEST_DATA1 may be a non-light emission voltage of the sub-pixels. The second test voltage TEST_DATA2 may be a light-emission voltage of the sub-pixels. The sub-pixels to which the first test voltage TEST_DATA1 is applied may not emit lights. The sub-pixels to which the second test voltage TEST_DATA2 is applied may emit lights. A voltage level of the first test voltage TEST_DATA1 may be higher than a voltage level of the second test voltage TEST_DATA2. For example, the voltage level of the first test voltage TEST_DATA1 may be about 7 V, and the voltage level of the second test voltage TEST_DATA2 may be about 3 V.

The transistors may be electrically connected to the fan-out lines FL, respectively. Each of the transistors may receive the first test voltage TEST_DATA1 or the second test voltage TEST_DATA2.

The transistors may include a first transistor T1, a second transistor T2, a third transistor T3, a fourth transistor T4, a fifth transistor T5, a sixth transistor T6, a seventh transistor T7, and an eighth transistor T8. The first to eighth transistors T1 to T8 connected to four adjacent pixels are shown in FIG. 6 based on the four adjacent pixels. The display panel test circuit 40 may have a configuration in which duplicates of the set of the first to eighth transistors T1 to T8 shown in FIG. 6 are sequentially arranged.

The first transistor T1 may include a first terminal connected to the first fan-out line FL1 electrically connected to the first red sub-pixel PR1 and the third blue sub-pixel PB3, a second terminal connected to the first test voltage line TVL1, and a gate terminal connected to the test control line TCL. When the test control signal TEST_GATE_OS having a turn-on level is applied, the first transistor T1 may transmit the first test voltage TEST_DATA1 to the first red sub-pixel PR1 and the third blue sub-pixel PB3 through the first fan-out line FL1 connected to the first transistor T1 and the first data line DL1.

The second transistor T2 may include a first terminal connected to the second fan-out line FL2 electrically connected to the first green sub-pixel PG1 and the fifth green sub-pixel PG5, a second terminal connected to the second test voltage line TVL2, and a gate terminal connected to the test control line TCL. When the test control signal TEST_GATE_OS having the turn-on level is applied, the second transistor T2 may transmit the second test voltage TEST_DATA2 to the first green sub-pixel PG1 and the fifth green sub-pixel PG5 through the second fan-out line FL2 connected to the second transistor T2 and the second data line DL2.

The third transistor T3 may include a first terminal connected to the first fan-out line FL1 electrically connected to the second green sub-pixel PG2 and the sixth green sub-pixel PG6, a second terminal connected to the first test voltage line TVL1, and a gate terminal connected to the test control line TCL. When the test control signal TEST_GATE_OS having the turn-on level is applied, the third transistor T3 may transmit the first test voltage TEST_DATA1 to the second green sub-pixel PG2 and the sixth green sub-pixel PG6 through the first fan-out line FL1 connected to the third transistor T3 and the first data line DL1.

The fourth transistor T4 may include a first terminal connected to the second fan-out line FL2 electrically connected to the first blue sub-pixel PB1 and the third red sub-pixel PR3, a second terminal connected to the first test voltage line TVL1, and a gate terminal connected to the test control line TCL. When the test control signal TEST_GATE_OS having the turn-on level is applied, the fourth transistor T4 may transmit the first test voltage TEST_DATA1 to the first blue sub-pixel PB1 and the third red sub-pixel PR3 through the second fan-out line FL2 connected to the fourth transistor T4 and the second data line DL2.

The fifth transistor T5 may include a first terminal connected to the first fan-out line FL1 electrically connected to the second blue sub-pixel PB2 and the fourth red sub-pixel PR4, a second terminal connected to the second test voltage line TVL2, and a gate terminal connected to the test control line TCL. When the test control signal TEST_GATE_OS having the turn-on level is applied, the fifth transistor T5 may transmit the second test voltage TEST_DATA2 to the second blue sub-pixel PB2 and the fourth red sub-pixel PR4 through the first fan-out line FL1 connected to the fifth transistor T5 and the first data line DL1.

The sixth transistor T6 may include a first terminal connected to the second fan-out line FL2 electrically connected to the third green sub-pixel PG3 and the seventh green sub-pixel PG7, a second terminal connected to the first test voltage line TVL1, and a gate terminal connected to the test control line TCL. When the test control signal TEST_GATE_OS having the turn-on level is applied, the sixth transistor T3 may transmit the first test voltage TEST_DATA1 to the third green sub-pixel PG3 and the seventh green sub-pixel PG7 through the second fan-out line FL2 connected to the sixth transistor T3 and the second data line DL2.

The seventh transistor T7 may include a first terminal connected to the first fan-out line FL1 electrically connected to the fourth green sub-pixel PG4 and the eighth green sub-pixel PG8, a second terminal connected to the second test voltage line TVL2, and a gate terminal connected to the test control line TCL. When the test control signal TEST_GATE_OS having the turn-on level is applied, the seventh transistor T7 may transmit the second test voltage TEST_DATA2 to the fourth green sub-pixel PG4 and the eighth green sub-pixel PG8 through the first fan-out line FL1 connected to the seventh transistor T7 and the first data line DL1.

The eighth transistor T8 may include a first terminal connected to the second fan-out line FL2 electrically connected to the second red sub-pixel PR2 and the fourth blue sub-pixel PB4, a second terminal connected to the second test voltage line TVL2, and a gate terminal connected to the test control line TCL. When the test control signal TEST_GATE_OS having the turn-on level is applied, the eighth transistor T8 may transmit the second test voltage TEST_DATA2 to the second red sub-pixel PR2 and the fourth blue sub-pixel PB4 through the second fan-out line FL2 connected to the eighth transistor T8 and the second data line DL2.

The first to eighth transistors T1 to T8 may be simultaneously turned on in response to the test control signal TEST_GATE_OS. Accordingly, the first test voltage TEST_DATA1 and the second test voltage TEST_DATA2 may be simultaneously transmitted to the corresponding sub-pixels disposed in the first pixel row PXR1 and the corresponding sub-pixels disposed in the second pixel row PXR2.

The first transistor T1, the second transistor T2, the third transistor T3, the fourth transistor T4, the fifth transistor T5, the sixth transistor T6, the seventh transistor T7, and the eighth transistor T8 may be sequentially arranged in the direction that is opposite to the first direction DR1. Accordingly, the first to eighth transistors T1 to T8 may be respectively connected to first and second fan-out lines FL1 and FL2 that are alternately arranged in the first direction DR1 in the first non-display area NDA1.

Two transistors respectively directly connected to a first fan-out line FL1 and a second fan-out line FL2 that are adjacent to each other in the first direction DR1 and are respectively electrically connected to sub-pixels configured to display the same color and arranged in the same pixel row may respectively receive different test voltages. For example, a fourth transistor T4 and a fifth transistor T5 are respectively directly connected to two fan-out lines FL2 and FL1; the two fan-out lines FL2 and FL1 are immediately adjacent to each other in the first direction DR1 (with no intervening fan-out line being disposed between the two fan-out lines FL2 and FL1) and are respectively electrically connected to blue sub-pixels PB1 and PB2 disposed in the first pixel row PXR1 and configured to display the same blue color; the transistors T4 and T5 may receive the first test voltage TEST_DATA1 and the second test voltage TEST_DATA2, respectively. As another example, an eighth transistor T8 and a first transistor T1 are respectively connected to two fan-out lines FL2 and FL1; the two fan-out lines FL2 and FL1 are immediately adjacent to each other in the first direction DR1 and are respectively electrically connected to red sub-pixels PR2 and PR1 disposed in the first pixel row PXR1 and configured to display a red color; the transistors T8 and T1 may receive the second test voltage TEST_DATA2 and the first test voltage TEST_DATA1, respectively.

Figure 7:
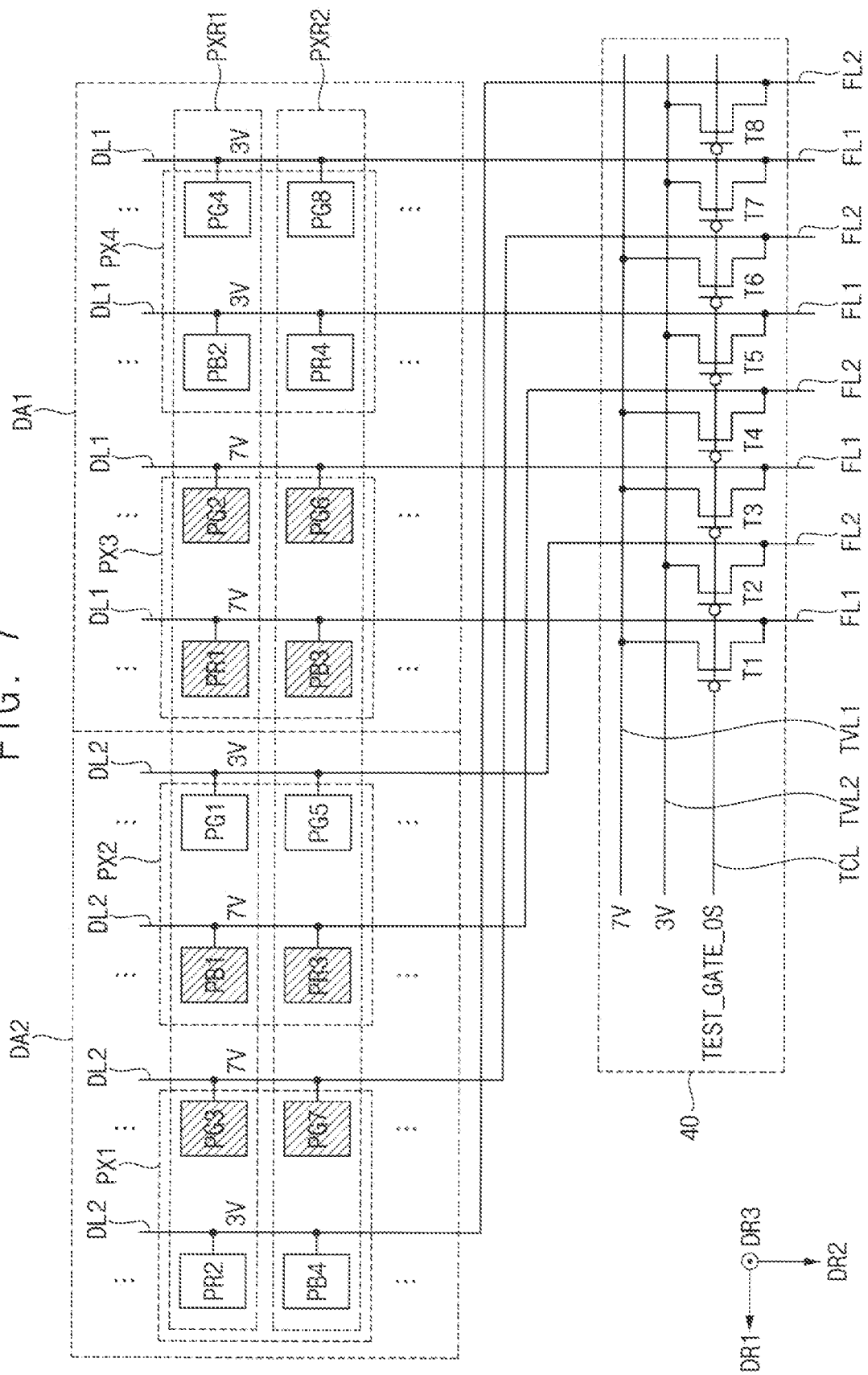
FIG. 7 and FIG. 8 are views for describing one or more tests for a display panel in which no unwanted short circuit and no unwanted open circuit have occurred according to one or more embodiments.
Figure 8:
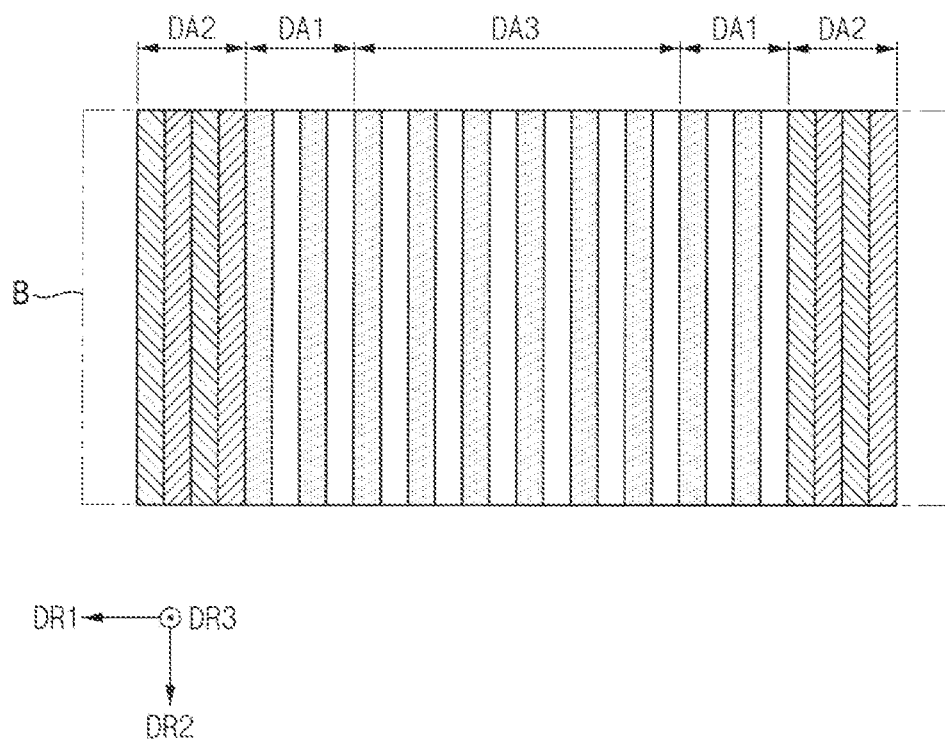

FIGS. 7 and 8 are views for describing on or more tests for a display panel 10 in which no unwanted short circuit and no unwanted open have occurred according to one or more embodiments. FIG. 8 may show a region B of FIG. 1.

Referring to FIGS. 7 and 8, when the test control signal TEST_GATE_OS having the turn-on level is applied to the display panel test circuit 40 for the open-short test, the first transistor T1, the third transistor T3, the fourth transistor T4, and the sixth transistor T6 may transmit the first test voltage TEST_DATA1 (e.g., about 7 V); and the second transistor T2, the fifth transistor T5, the seventh transistor T7, and the eighth transistor T8 may transmit the second test voltage TEST_DATA2 (e.g., about 3 V).

When no unwanted open circuit or unwanted short circuit occurs in the fan-out lines FL, the first pixel PX1 (including the second red sub-pixel PR2, the third green sub-pixel PG3, the fourth blue sub-pixel PB4, and the seventh green sub-pixel PG7) may display a magenta color, and the second pixel PX2 (including the first blue sub-pixel PB1, the first green sub-pixel PG1, the third red sub-pixel PR3, and the fifth green sub-pixel PG5) may display a green color. When no open circuit or unwanted short circuit occurs in the fan-out lines FL, the third pixel PX3 (including the first red sub-pixel PR1, the second green sub-pixel PG2, the third blue sub-pixel PB3, and the sixth green sub-pixel PG6) may display a black color, and the fourth pixel PX4 (including the second blue sub-pixel PB2, the fourth green sub-pixel PG4, the fourth red sub-pixel PR4, and the eighth green sub-pixel PG8) may display a white color.

When no unwanted open circuit or unwanted short circuit occurs in the fan-out lines FL, an image including black lines and white lines extending in the second direction DR2 and alternately arranged in the first direction DR1 may be displayed in the first display area DA1; an image including magenta lines and green lines extending in the second direction DR2 and alternately arranged in the first direction DR1 may be displayed in the second display area DA2; and, similar to the first display area DA1, an image including black lines and white lines extending in the second direction DR2 and alternately arranged in the first direction DR1 may be displayed in the third display area DA3.

Figure 9:
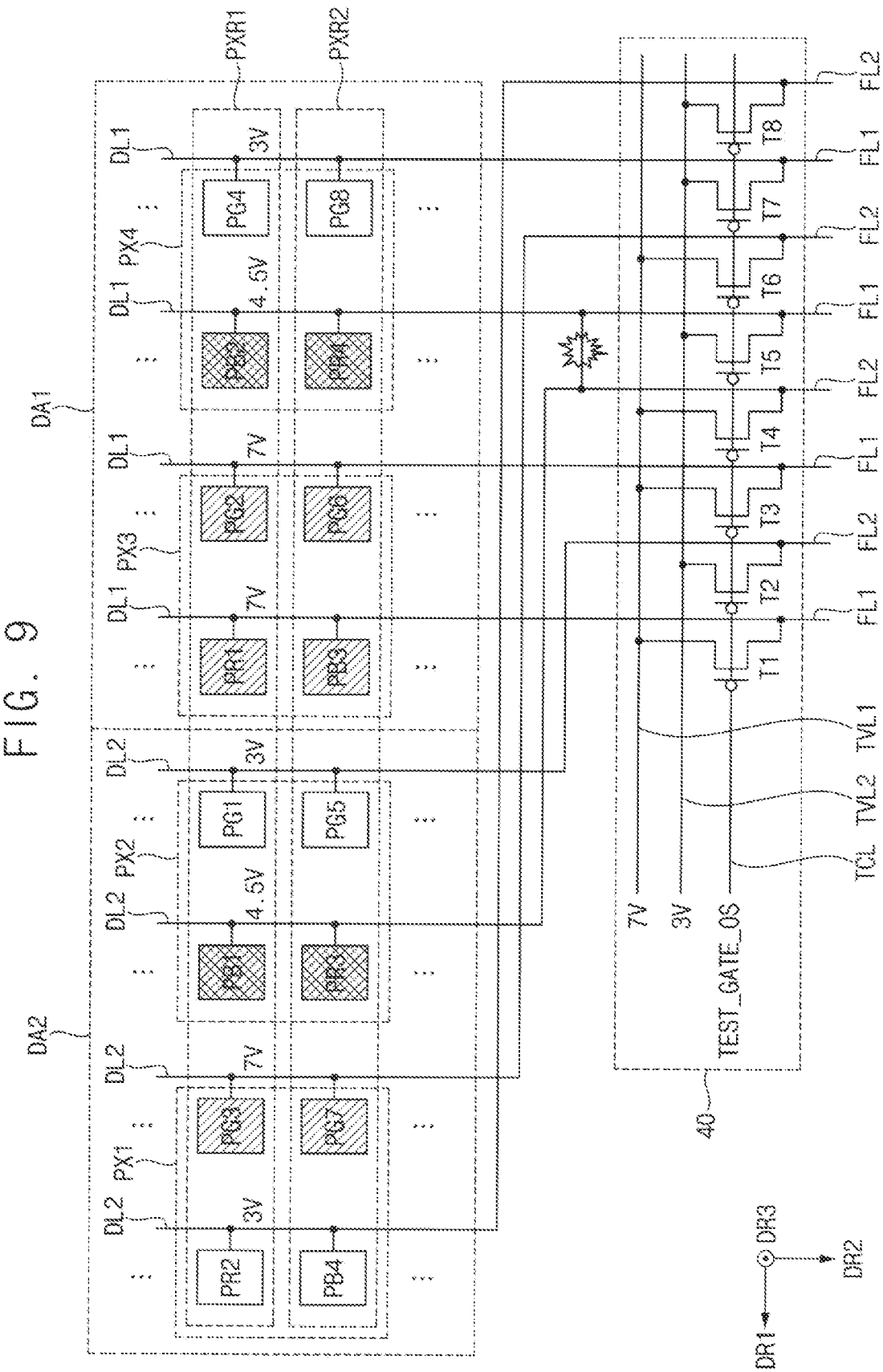
FIG. 9 is a view for describing a test for the display panel in which an unwanted short circuit has occurred according to one embodiment.

FIG. 9 is a view for describing the test for the display panel 10 in which an unwanted short circuit has occurred according to one embodiment.

Referring to FIG. 9, when an unwanted short circuit occurs between two fan-out lines FL, the test voltages applied to the sub-pixels electrically connected to the short-circuited fan-out lines FL may change. For example, referring to FIG. 9, when a short circuit occurs between the second fan-out line FL2 connected to the fourth transistor T4 and the first fan-out line FL1 connected to the fifth transistor T5, the test voltages applied to the first blue sub-pixel PB1 and the second blue sub-pixel PB2, which are electrically connected to the short-circuited fan-out lines FL2 and FL1, respectively, may change from the first test voltage TEST_DATA1 (e.g., about 7 V) and the second test voltage TEST_DATA2 (e.g., about 3 V) to about 4.5 V. As a result, an image displayed by the second pixel PX2 and the fourth pixel PX4 may be different from an image displayed by the second pixel PX2 and the fourth pixel PX4 when there is no unwanted open or short circuit as shown in FIG. 7. Accordingly, the short circuit may be detected using an image displayed in the display area DA.

According to a comparative example, two transistors respectively directly connected to a first fan-out line and a second fan-out line that are adjacent to each other in a first direction DR1 and respectively electrically connected to sub-pixels configured to display the same color and arranged in the same pixel row may receive the same test voltage. In this case, even when an unwanted short circuit occurs between the first fan-out line and the second fan-out line, a voltage that is equal to the test voltage may be applied to the sub-pixels, so that the short circuit may not be detected using an image displayed in a display area DA.

According to embodiments, since two transistors directly connected to a first fan-out line and a second fan-out line that are adjacent to each other in the first direction DR1 and respectively electrically connected to sub-pixels configured to display the same color and arranged in the same pixel row respectively receive two different test voltages, when a short circuit occurs between the first fan-out line and the second fan-out line, a voltage that is different from the two test voltages may be applied to the sub-pixels, so that the short circuit may be detected using the image displayed in the display area DA.

Figure 10:
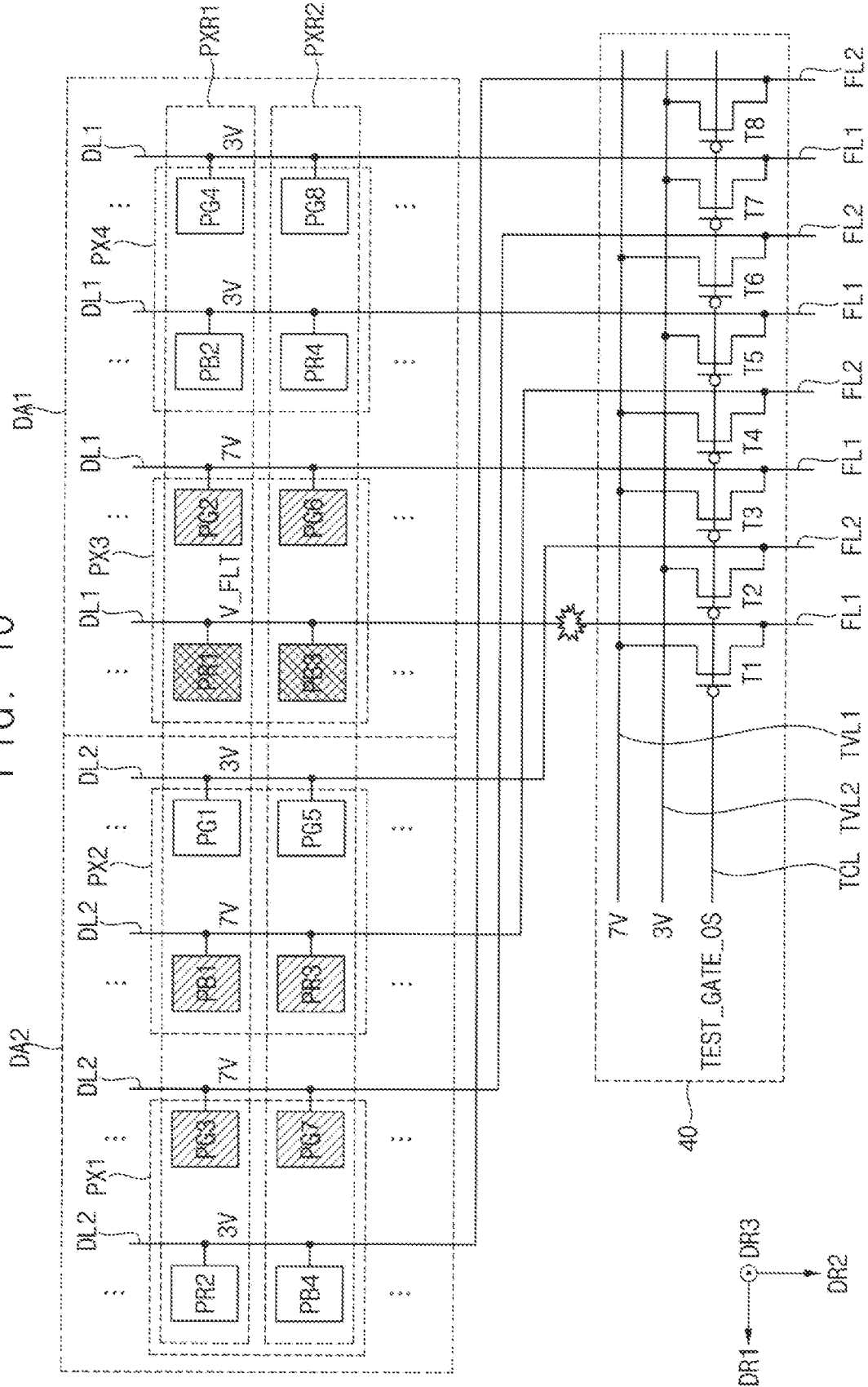
FIG. 10 is a view for describing a test for the display panel in which an unwanted open circuit has occurred according to one embodiment.

FIG. 10 is a view for describing a test for the display panel 10 in which an unwanted open circuit has occurred according to one embodiment.

Referring to FIG. 10, when an open circuit occurs in a fan-out line FL, the test voltage applied to the sub-pixel electrically connected to the open/broken fan-out line FL may change. For example, referring to FIG. 10, when the open circuit occurs in the first fan-out line FL1 connected to the first transistor T1, a voltage V_FLT applied to the first red sub-pixel PR1 electrically connected to the open/broken first fan-out line FL1 may be floated. As a result, an image displayed by the third pixel PX3 may be different from an image displayed by the third pixel PX3 when there is no unwanted open or short circuit as shown in FIG. 7. Accordingly, the open circuit may be detected using the image displayed in the display area DA.

The display device may be included in a computer, a notebook, a mobile phone, a smart phone, a smart pad, a PMP, a PDA, an MP3 player, or the like.

Although embodiments have been described with reference to the drawings, the described embodiments are examples and may be changed without departing from the scope specified in the following claims.

What is claimed is:

1. A display device comprising:
   a first pixel row including a first first-color sub-pixel and a second first-color sub-pixel both configured to display a first color;
   a first first-structure transmission line;
   a first second-structure transmission line neighboring the first first-structure transmission line with no intervening transmission line disposed in a display panel test circuit and connected to a sub-pixel which displays a different color than the first color;
   a first transistor electrically connected through the first first-structure transmission line to the first first-color sub-pixel and configured to receive a first test voltage; and
   a second transistor electrically connected through the first second-structure transmission line to the second first-color sub-pixel and configured to receive a second test voltage different from the first test voltage,
   wherein the first transistor and the second transistor are disposed in a non-display area of the display device.

2. The display device of claim 1, wherein the first transistor and the second transistor are aligned in a direction parallel to the first pixel row.

3. The display device of claim 1, further comprising:
   a second first-structure transmission line;
   a second second-structure transmission line;
   a third first-structure transmission line;
   a third transistor configured to receive the second test voltage;

a fourth transistor configured to receive the first test voltage; and a fifth transistor configured to receive the second test voltage, wherein the first pixel row further includes a first second-color sub-pixel, a second second-color sub-pixel, and a first third-color sub-pixel disposed between the first first-color sub-pixel and the second first-color sub-pixel, wherein each of the first second-color sub-pixel and the second second-color sub-pixel is configured to display a second color, wherein the first third-color sub-pixel is configured to display a third color, wherein the first color, the second color, and the third color are different from each other, wherein the first second-color sub-pixel is electrically connected through the second first-structure transmission line to the third transistor, wherein the second second-color sub-pixel is electrically connected through the second second-structure transmission line to the second transistor, and wherein the first third-color sub-pixel is electrically connected through the third first-structure transmission line to the third transistor.

4. The display device of claim 3, wherein the display device includes a first display area and a second display area, wherein the first first-color sub-pixel is included in the first display area, wherein the second first-color sub-pixel is included in the second display area, and wherein when no unwanted open circuit or unwanted short circuit occurs in the third first-structure transmission line, the first first-structure transmission line, and the first second-structure transmission line, the first display area displays black lines and white lines alternately arranged in a lengthwise direction of the first pixel row, and the second display area displays magenta lines and green lines alternately arranged in the lengthwise direction of the first pixel row.

5. The display device of claim 1, further comprising a substrate, wherein the first first-structure transmission line is disposed closer to the substrate than the first second-structure transmission line.

6. The display device of claim 5, further comprising:

a first data line;

a second data line electrically isolated from the first data line; and a connection line, wherein the first first-structure transmission line is directly connected to the first data line and is electrically connected through the first data line to the first first-color sub-pixel, and wherein the first second-structure transmission line is electrically connected through the connection line and the second data line to the second first-color sub-pixel.

7. The display device of claim 6, wherein the connection line includes a first connection line section extending parallel to the first pixel row and includes a second connection line section extending not parallel to the first pixel row, wherein the first connection line section is disposed farther from the substrate than the first second-structure transmission line, and wherein the second connection line section is disposed farther from the substrate than the first connection line section.

8. A display device comprising, a first pixel row including a first first-color sub-pixel and a second first-color sub-pixel both configured to display a first color;

a first first-structure transmission line;

a first second-structure transmission line neighboring the first first-structure transmission line with no intervening transmission line disposed in a display panel test circuit and connected to a sub-pixel which displays a different color than the first color;

a first transistor electrically connected through the first first-structure transmission line to the first first-color sub-pixel and configured to receive a first test voltage; and a second transistor electrically connected through the first second-structure transmission line to the second first-color sub-pixel and configured to receive a second test voltage different from the first test voltage, wherein the first transistor includes a first terminal electrically connected to the first first-structure transmission line and includes a second terminal configured to receive the first test voltage, wherein the second transistor includes a first terminal electrically connected to the first second-structure transmission line and includes a second terminal configured to receive the second test voltage, and wherein the second transistor neighbors the first transistor with no intervening transistor.

9. The display device of claim 8, wherein the first test voltage is higher than the second test voltage.

10. The display device of claim 8, wherein the first test voltage is a non-light emission voltage for the first first-color sub-pixel, and wherein the second test voltage is a light emission voltage for the second first-color sub-pixel.

11. The display device of claim 8, wherein each of a gate terminal of the first transistor and a gate terminal of the second transistor is configured to receive a test control signal.

12. The display device of claim 11, wherein the first transistor and the second transistor are simultaneously turned on in response to the test control signal.

13. A display panel test circuit for testing a display panel, the display panel comprising a first pixel row that includes a first first-color sub-pixel and a second first-color sub-pixel both configured to display a first color, the display panel further comprising a first first-structure transmission line and a first second-structure transmission line, the display panel test circuit comprising:

a first transistor electrically connected through the first first-structure transmission line to the first first-color sub-pixel and configured to receive a first test voltage; and a second transistor electrically connected through the first second-structure transmission line to the second first-color sub-pixel and configured to receive a second test voltage different from the first test voltage, wherein the first second-structure transmission line neighbors the first first-structure transmission line with no intervening transmission line disposed in a display panel test circuit and connected to a sub-pixel which displays a different color than the first color, wherein the first transistor and the second transistor are disposed in a non-display area of the display panel.

14. The display panel test circuit of claim 13, wherein the first transistor includes a first terminal electrically connected to the first first-structure transmission line electrically and includes a second terminal configured to receive the first test voltage,
- wherein the second transistor includes a first terminal electrically connected to the first second-structure transmission line and includes a second terminal configured to receive the second test voltage, and
- wherein the second transistor neighbors the first transistor with no intervening transistor.

15. The display panel test circuit of claim 14, wherein the first transistor and the second transistor are aligned in a direction parallel to the first row.

16. The display panel test circuit of claim 14, wherein the first test voltage is higher than the second test voltage.

17. The display panel test circuit of claim 14, wherein the first test voltage is a non-light emission voltage for the first first-color sub-pixel, and
- wherein the second test voltage is a light emission voltage for the second first-color sub-pixel.

18. The display panel test circuit of claim 14, wherein each of a gate terminal of the first transistor and a gate terminal of the second transistor is configured to receive a test control signal.

19. The display panel test circuit of claim 18, wherein the first transistor and the second transistor are simultaneously turned on in response to the test control signal.

20. The display panel test circuit of claim 13, further comprising:
- a third transistor configured to receive the second test voltage;
- a fourth transistor configured to receive the first test voltage; and
- a fifth transistor configured to receive the second test voltage,
- wherein the first pixel row further includes a first second-color sub-pixel, a second second-color sub-pixel, and a first third-color sub-pixel disposed between the first first-color sub-pixel and the second first-color sub-pixel,
- wherein each of the first second-color sub-pixel and the second second-color sub-pixel is configured to display a second color,
- wherein the first third-color sub-pixel is configured to display a third color,
- wherein the first color, the second color, and the third color are different from each other,
- wherein the display panel further comprises a second first-structure transmission line, a second second-structure transmission line, and a third first-structure transmission line,
- wherein the first second-color sub-pixel is electrically connected through the second first-structure transmission line to the third transistor,
- wherein the second second-color sub-pixel is electrically connected through the second second-structure transmission line to the second transistor, and
- wherein the first third-color sub-pixel is electrically connected through the third first-structure transmission line to the third transistor.

* * * * *